US006870094B2

(12) United States Patent
Otaki

(10) Patent No.: US 6,870,094 B2
(45) Date of Patent: Mar. 22, 2005

(54) ELECTRONIC APPARATUS

(75) Inventor: Toru Otaki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/810,582

(22) Filed: Mar. 29, 2004

(65) Prior Publication Data

US 2004/0198078 A1 Oct. 7, 2004

(30) Foreign Application Priority Data

Apr. 2, 2003 (JP) ....................................... 2003-099630
Feb. 10, 2004 (JP) ....................................... 2004-033509

(51) Int. Cl.[7] .................................................. H05K 9/00
(52) U.S. Cl. ............................... 174/35 GC; 174/35 R; 361/816; 361/752
(58) Field of Search .......................... 174/35 R, 35 GC; 361/816, 818, 800, 752

(56) References Cited

U.S. PATENT DOCUMENTS 4,831,498 A * 5/1989 Baba .......................... 361/816
5,748,449 A * 5/1998 Tahmassebpur ............. 361/753
5,750,923 A * 5/1998 Wu .......................... 174/35 R
6,016,083 A * 1/2000 Satoh .......................... 333/12
6,147,879 A * 11/2000 Batten et al. ............... 361/800
6,590,153 B1 * 7/2003 Kohan ...................... 174/35 C

* cited by examiner

*Primary Examiner*—Hung V. Ngo
(74) *Attorney, Agent, or Firm*—Fitzpatrick, Cella, Harper & Scinto

(57) ABSTRACT

An electronic apparatus is provided which causes less radiation noise leakage through an aperture with a shielding box in a compact size. The apparatus has a shielding box encasing a printed circuit board connected to a cable. The shielding box has a cable-regulating portion which seals the aperture of the shielding box for leading out the cable connected to the printed board and presses the cable against the bottom plate of the shielding box. Thereby the radiation noise caused by common-mode current in the cable is also reduced.

9 Claims, 8 Drawing Sheets

ELECTRONIC APPARATUS

BACKGROUND OF THE INVENTION

1. Field of the Invention

The present invention relates to a shielding box for encasing a printed circuit board connected to a cable, particularly to a shielding box for decrease of radiation noise leakage through an aperture for leading out the cable and decrease of radiation noise generated by the cable itself. The present invention relates also to an electronic apparatus having the shielding box, and a method of fixing the cable.

2. Related Background Art

In recent years, the clock frequency of digital circuits of electronic apparatuses is being made higher and higher. However, the high frequency for the digital signal tends to cause radiation noise to result in malfunction of a separate electronic apparatus. Therefore, the radiation noise emission is an object of the regulation.

For decrease of the radiation noise, a shielding box shown in FIG. 13 is known for encasing a printed circuit board to shield the radiation noise emission. In FIG. 13, the numeral 4 denotes a printed circuit board which produces radiation noise, and the numeral 32 denotes a cable connected to the printed circuit board 4. Cable 32 also produces much radiation noise on transmission and reception of high frequency signals. Shielding box 30 encases printed circuit 4 to shield the radiation noise emission from the printed circuit to the outside. Aperture 31 is formed at the side face of shielding box 30. Through this aperture 31, cable 32 is led out for connection to an external apparatus.

However, radiation noise leaks out more or less through aperture 31.

As a countermeasure against the radiation noise leakage from the aperture, Japanese Utility Model Application Laid-Open No. H3-122597 discloses an encasing box having an aperture sealed completely with an electroconductive bushing for cable penetration. Japanese Patent Application Laid-Open No. H9-102692 discloses a structure having a tubular waveguide joined to the aperture to decrease the radiation noise emitted outside from the shielding box. Japanese Patent Application Laid-Open No. H11-330761 discloses an electromagnetic wave-absorbing sheet which is larger in area than the aperture and is placed inside the shielding box around the aperture.

However, the structure employing a bushing described in Japanese Utility Model Application Laid-Open No. H3-122597, or the structure employing a waveguide disclosed in Japanese Patent Application Laid-Open No. H9-102692 requires necessarily an additional part, or complicated working for connection of the bushing or waveguide. The waveguide placed in the shielding box; or the electromagnetic wave-absorbing sheet placed around the aperture described in Japanese Patent Application Laid-Open No. H11-330761 occupies the space in the shielding box and decreases the freedom for arrangement of the printed circuit board or other members. This necessitates a larger space of the shielding box, which does not meet the recent demand for miniaturization of electronic apparatuses.

The above Japanese Patent Application Laid-Open No. H9-102692 also describes that the radiation noise leaks not only from the aperture of the shielding box but also is emitted from the cable: a common electric current flows in the outside coat of the shielded cable or in the entire of the non-shielded cable to produce radiation noise.

In FIG. 13, when cable 32 led out through aperture 31 is not fixed at a position, the positional relation of cable 32 to electroconductive shielding box 30 can vary to cause variation of the impedance of cable 32, which is an important factor of radiation noise emission. The positional variation of cable 32 can damage cable 32 itself.

The variation of height of the cable can cause variation of the radiation noise level. A slight deviation in height of the cable by conveyance of the electronic apparatus will cause variation of the produced radiation noise level.

SUMMARY OF THE INVENTION

An object of the present invention is to reduce radiation noise leakage through an opening in a shielding box without decreasing the space in the shielding box without impairing freedom for arrangement of the printed circuit or the like without using an additional part. Another object of the present invention is to decrease radiation noise caused by common-mode current in the cable.

According to an aspect of the present invention, there is provided an electronic apparatus comprising a printed circuit board; a cable connected to the printed circuit board; and a shielding box which is comprised of a top cover, a bottom metal plate and side plates for encasing the circuit board therein and from which the cable is led out through an aperture formed at the lower end of one of the side plates, wherein the cable led out of the shielding box is kept pressed by the one of the side plates against the bottom metal plate.

The lower end of one of the side plate has preferably a first section for pressing the cable, and a second section for fixation to the bottom metal plate, and the aperture is preferably formed with a bent portion of the first section and the face of the bottom metal plate to have an aperture height corresponding to the thickness of the cable.

The bottom metal plate extends preferably to form a projection toward a leading-out direction of the cable, the second section joining the lower end is a second tab formed toward the cable leading-out direction, and the projection and the second tab are connected and fixed together.

The first section joining the lower end portion is a first tab formed toward the cable leading-out direction, which tab presses the cable against the projection.

According to another aspect of the present invention, there is provided an electronic apparatus comprising a printed circuit board; a cable connected to the printed circuit board; a shielding box which is comprised of a top cover, a bottom metal plate, and side plates for encasing the circuit board therein and from which the cable is led out through an aperture formed at the lower end of one of the side plates; and a cable-regulating portion which seals the aperture and presses the cable against the bottom metal plate.

The cable-regulating portion is preferably comprised of an elastic member, or more preferably comprised of an electroconductive material or high dielectric loss material.

The cable-regulating portion has preferably a slit, and is attached to the side plate of the shielding box with the slit.

According to a further aspect of the present invention, there is provided an electronic apparatus comprising a printed circuit board; a cable connected to the printed circuit board; a shielding box which is comprised of a top cover, a bottom metal plate and side plates for encasing the circuit board therein and from which the cable is led out through an aperture formed at the lower end of one of the side plates; and a casing body for carrying the shielding box, wherein the cable led out of the shielding box is kept pressed by the one of the side plates against the bottom metal plate, and the cable led out is wired along the casing body.

The above and other object, features and advantages of the invention will become more apparent from the following detailed description taken in conjunction with the accompanying drawings.

DETAILED DESCRIPTION OF THE PREFERRED EMBODIMENTS

Figure 1:
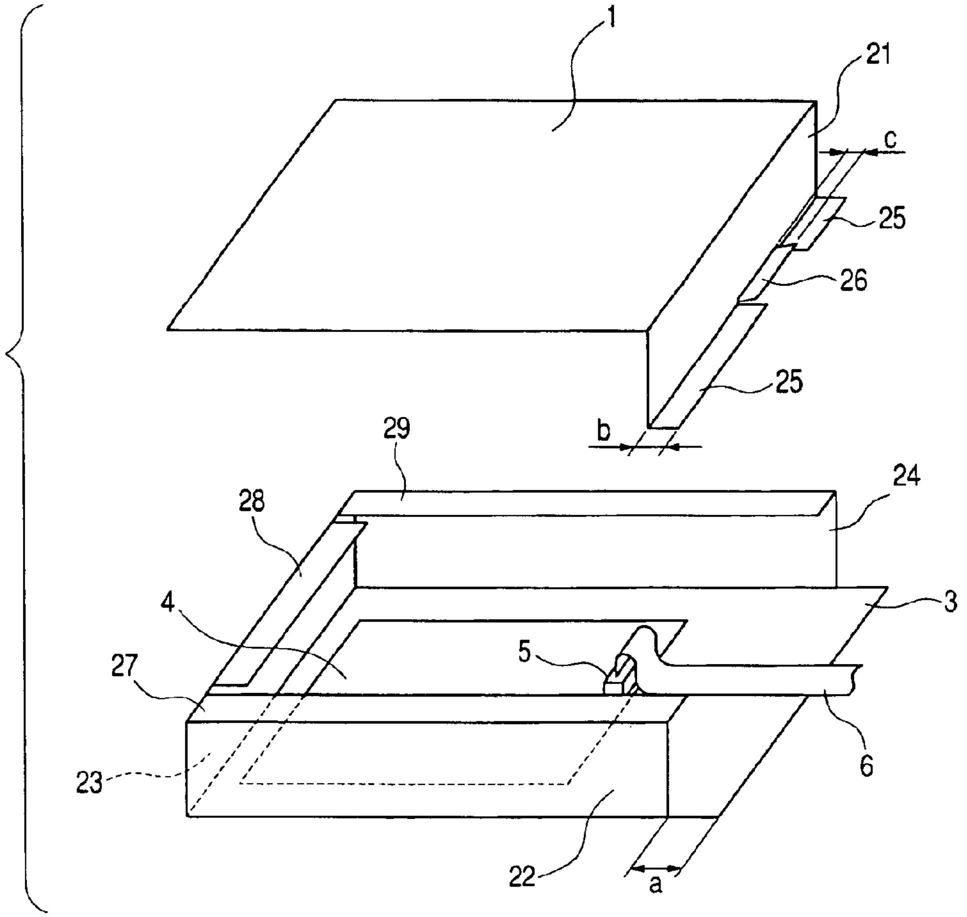
FIG. 1 is a perspective view of an exploded shielding box of Example 1.

Examples 1 to 4 of the electronic apparatus of the present invention are explained by reference to FIGS. 1 to 12. Throughout the drawings, the same reference numerals and symbols are used commonly for corresponding members.

EXAMPLE 1

Figure 2:
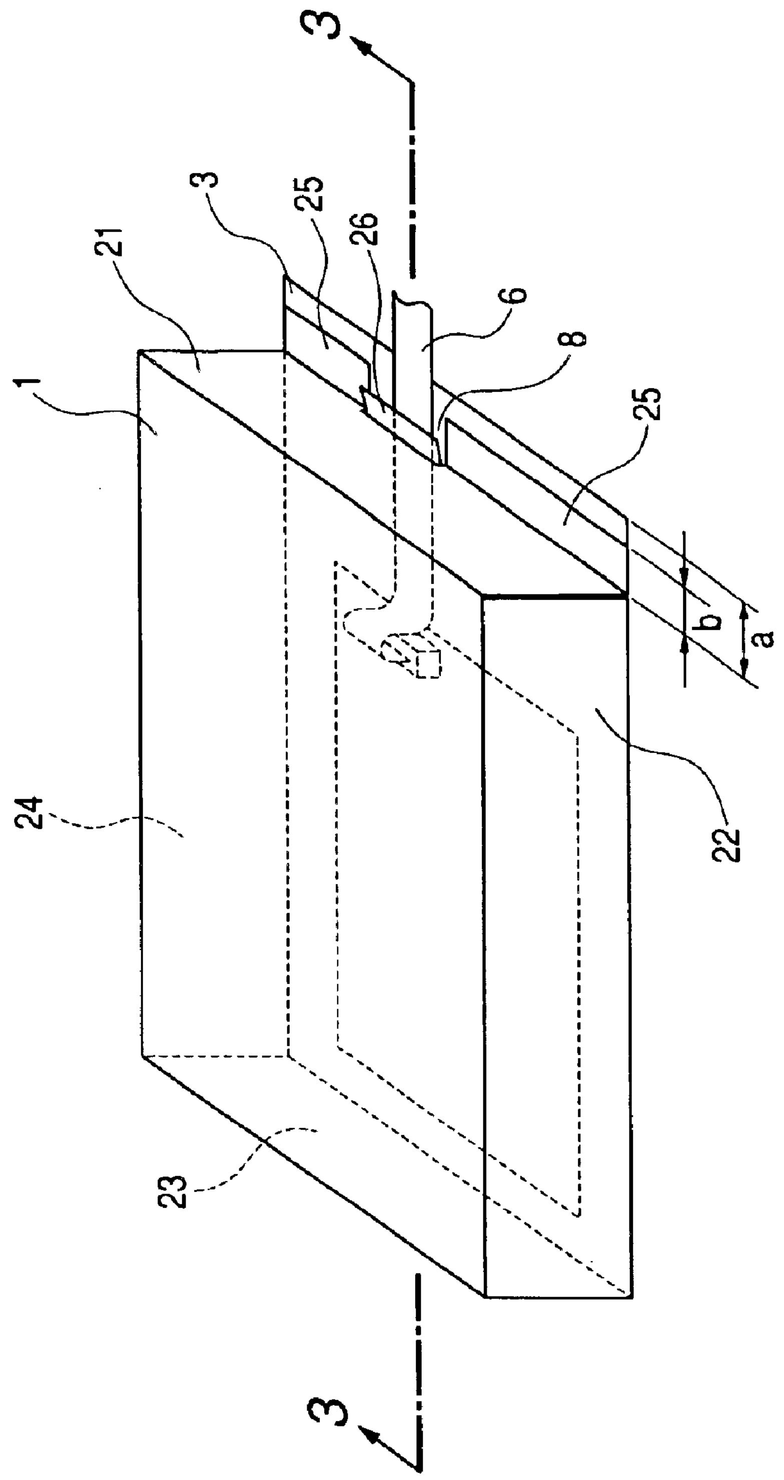
FIG. 2 is a perspective view of a shielding box of Example 1.
Figure 3:
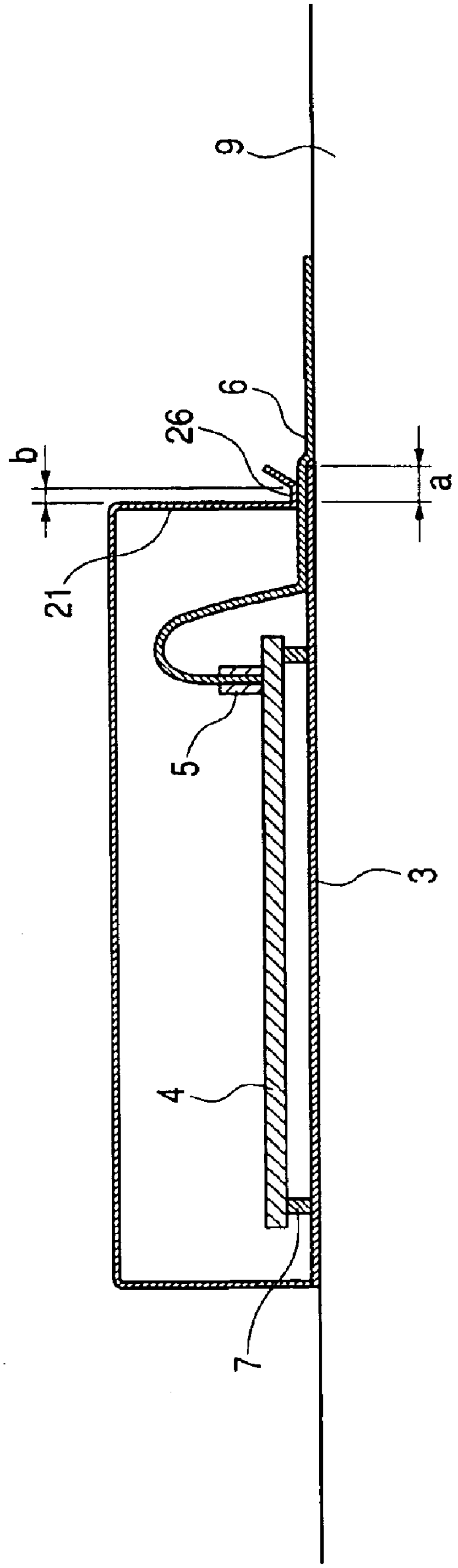
FIG. 3 is a sectional view of a shielding box of Example 1.

FIGS. 1 to 3 illustrate Example 1 of the present invention. The shielding box is comprised of top cover 1, bottom metal plate 3, and side plates 21,22,23 and 24. FIG. 1 is a perspective view of an exploded shielding box, showing a metal plate comprised integrally of top cover 1 and side plate 21 separated from the main body of the shielding box comprised of bottom metal plate 3 and side plates 22,23 and 24.

Printed circuit board 4 is placed with interposition of spacer 7 mentioned later on bottom metal plate 3 of the shielding box. The printed circuit board is connected through connector 5 to cable 6. Cable 6 is led out through side plate 21. Bottom metal plate 3 projects out of the shielding box in length a in the lead-out direction of cable 6, namely perpendicularly to side plate 21. The metal plate comprised integrally of top cover 1 and side plate 21 of the shielding box is fixed by screws securely to the inwardly bent top margins 27, 28 and 29 of side plates 22,23 and 24 and to the projection of length a of bottom metal plate 3. Thereby the electromagnetic wave in the shielding box will not leak out through the connecting portion. At the middle of the lower end portion of side plate 21, the main portion of side plate 21 joins, at a bend comprised in an aperture for leading out the cable, a tab 26 as a first section at the lower end portion of the side plate. Tab 26 may have a distance c of 1 to 30 mm from the face of the main body of side plate 21. The lower end portions of side plate 21 on the both sides of tab 26 are bent perpendicularly to the main portion of side plate 21 to form tabs 25 as second sections at the lower end portion of the side plate. The length b of tab 25 is designed preferably to be the same as or longer than distance c of tab 26, and to be shorter than the length a of the projection of bottom metal plate 3. The length b is designed to be 5–30 mm. The bend portions of the lower end of side plate 21 having tabs 25,26 are different in the bending height corresponding to the thickness of cable 6. Therefore, the level of the bent face of tab 26 is different from the level of the bent faces of tabs 25 in correspondence with the thickness of cable 6.

FIG. 2 is a perspective view of the shielding box having the metal plate comprised of top cover 1 and side plate 21 of the shielding box attached to the main body of the shielding box comprised of bottom metal plate 3 and side plates 22, 23 and 24. FIG. 3 is a sectional view of the shielding box taken along line 3—3 in FIG. 2. As shown in FIG. 3, the printed circuit board 4 is placed with interposition of spacer 7 on bottom metal plate 3 of the shielding box. The shielding box is placed on electroconductive casing body 9.

In FIG. 2, side plate 21 is fixed surely by bonding the tab 25 of length b to the projection of length a of bottom metal plate 3. In this state, the aperture 8 is formed at the middle end of side plate 21 with the aid of a difference in level between a lower end portion consisting of a bend at which the main portion of side plate 21 joins a tab 26 (hereinafter referred to as "a middle lower end portion") and lower end portions consisting of bends at which the main portion of side plate 21 joins tabs 25 (hereinafter referred to as "right and left lower end portions"), which aperture 8 comprises a top edge consisting of the middle lower end portion and a bottom edge consisting of a face of bottom metal plate 3. The height of aperture 8 is designed to be approximate to the thickness of cable 6. Thereby cable 6 is pressed against bottom metal plate 3 by the middle lower end portion of side plate 21 and/or tab 26. The pressed cable is wired in the pressed state along the casing body 9 to a separate apparatus.

The projection of bottom metal plate 3 and tabs 25 of side plate 21 are not essential. However, they are preferably provided for securely bonding side plate 21 to bottom metal plate 3. Tab 26 of side plate 21 is also not essential. However, they are preferably provided for pressing the cable 6 securely against bottom metal plate 3. Incidentally for ease of working, the length d of tab 26 is preferably made equal to the length b of tabs 25.

The above structure enables decrease of the opening area of the aperture of the shielding box, and decrease of radiation noise leaking out from the shielding box.

Further, cable 6 can be led out of the shielding box in complete contact with bottom metal plate 3 and casing body 9, which decreases greatly radiation noise caused by common-mode current in cable 6. In other words, when a metal casing body is placed close to the cable and a common-mode current flows in the cable, a current is caused to flow in the metal casing body in the direction reverse to the common-mode current to lower the generation level of the radiation noise. The closer the cable to the metal casing body, the less is the generation of the radiation noise. The aforementioned structure of the present invention enables placement of the cable closest to the face of the metal casing body of the electronic apparatus.

The undesirable variation of the radiation noise level caused by variation of the cable height owing to conveyance of the electronic apparatus can be prevented by pressing and fixing the cable, in this Example.

In this Example, tab 26 presses cable 6 against bottom metal plate 3 and casing body 9 to fix securely the position of cable 6 without damaging the cable. Tab 26 for the cable fixation can be formed simply by merely bending the side plate 21. Cable 6 can be easily held in contact with the bottom face of the shielding box with the aid of projecting in length a.

(Experiment 1)

An electronic apparatus containing a shielding box shown in FIGS. 1–3 was prepared, and the radiation noise was measured. The prepared shielding box is in a shape of a rectangular solid, having a size of 250 mm long, 300 mm wide, and 70 mm high. Top cover 1, and side plates 21,22,23 and 24 have a thickness of 1 mm. The length a of the projection of bottom metal plate 3 is 20 mm, the length b of tab 25 of side plate 21 is 10 mm, and the length d of tab 26 of side plate 21 is 10 mm. The width of tab 26 (i.e., the width of aperture 8) is 50 mm, and the height of aperture 8 is 10 mm. The metal plate comprised integrally of top cover 1 and side plate 21 is fixed at tab 25 of length b to bottom metal plate 3 by screws (not shown in the drawings). Top cover 1 is fixed to inwardly bent top margins 27, 28 and 29 of side plates 22, 23 and 24 by screws. Printed circuit board 4 is a digital substrate of 220 mm long and 270 mm wide driven by high frequency of 20 MHz, and is placed on bottom metal plate 3 with interposition of spacer 7 of 5 mm high by fixation at four corners. Cable 6 is a shielded cable of 48 mm wide and 1 mm thick, and is connected to printed circuit board 4 with interposition of connector 5. This shielded cable transmits and receives high frequency of 20 MHz. The other end of the cable is connected through a connector to a separate printed circuit board encased in another similar shielding box (not shown in the drawings).

Separately, a comparative electronic apparatus is prepared which has the same constitution as the above electronic apparatus except that the height is changed to 5 mm.

Figure 4:
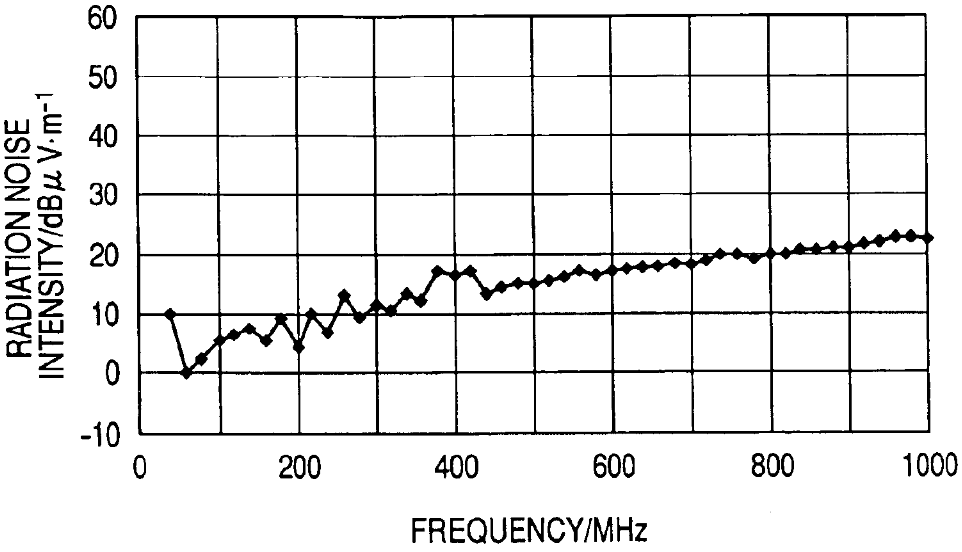
FIG. 4 is a graph showing the results of the experiment in Example 1.
Figure 5:
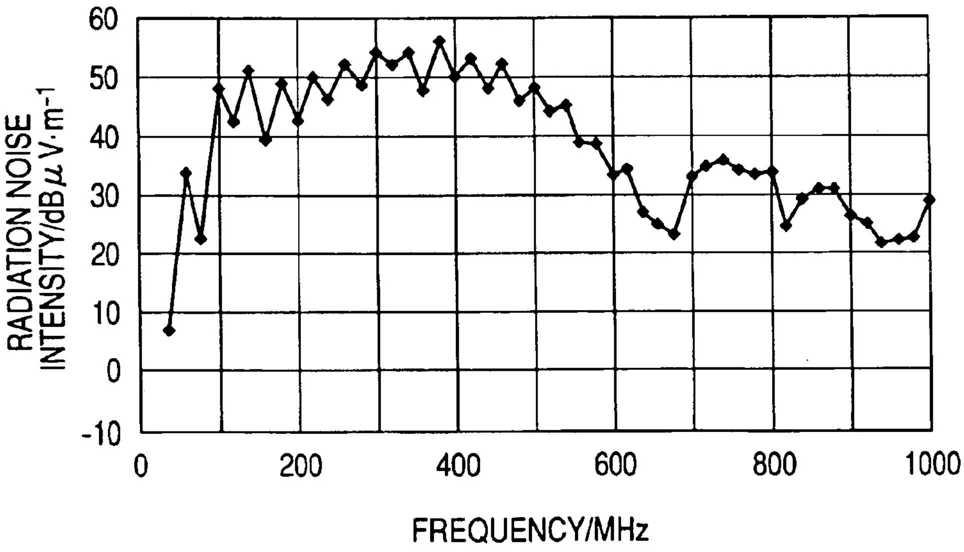
FIG. 5 is a graph showing the results of the comparative experiment in Example 1

The radiation noise is measured by bringing the objective electronic apparatus into an electromagnetically shielded chamber, measuring horizontally polarized wave by a 3 m method. FIG. 4 shows the measurement results of the electronic apparatus of the present invention. FIG. 5 shows the measurement results of the comparative electronic apparatus.

As shown in FIG. 4, with the electronic apparatus of the present invention, the radiation noise intensity is not higher than 25 dBμV/m at frequencies up to 1000 MHz, which radiation noise has little influence thereon. On the other hand, as shown in FIG. 5, with the comparative electronic apparatus, the radiation noise intensity is higher at the frequencies up to 1000 MHz, particularly up to 600 MHz or lower.

EXAMPLE 2

Figure 6:
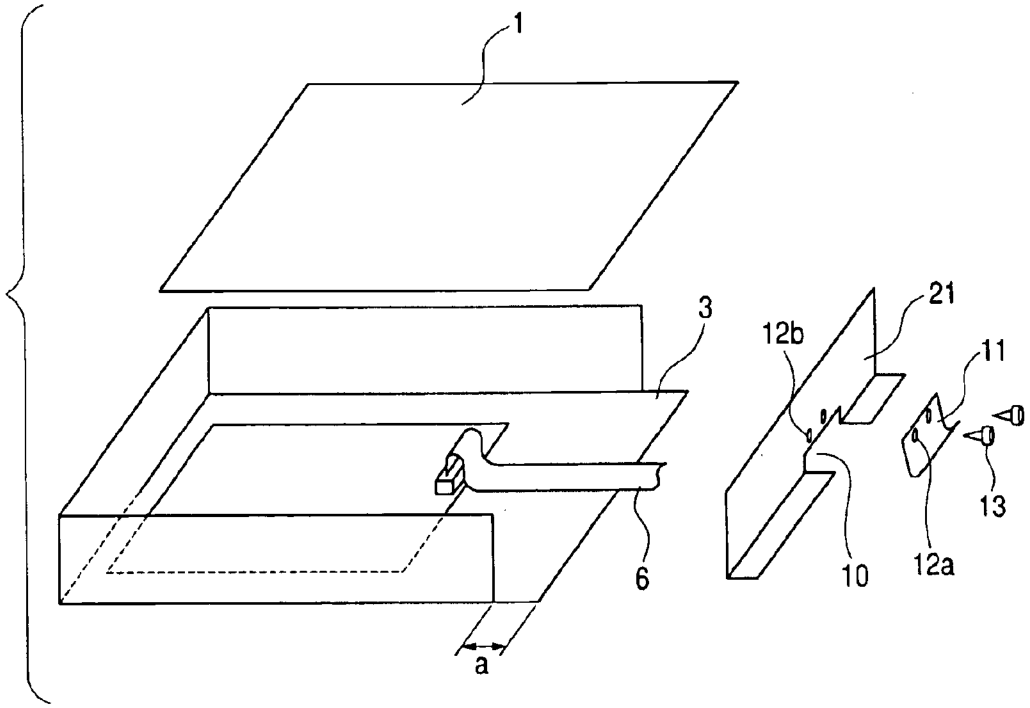
FIG. 6 is a perspective view of an exploded shielding box of Example 2.
Figure 7:
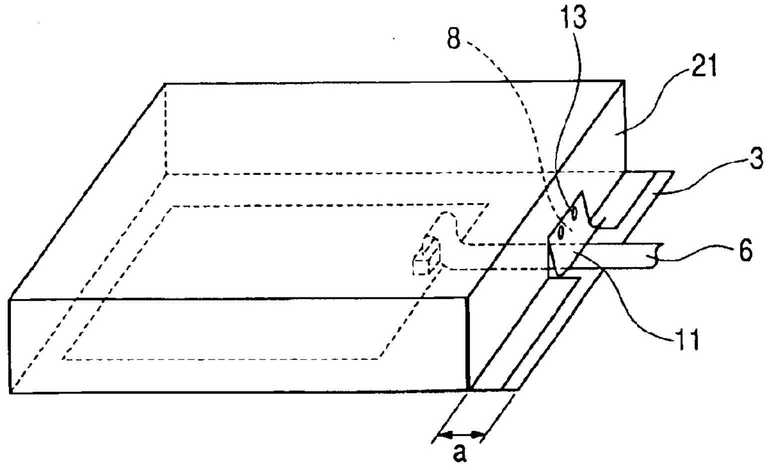
FIG. 7 is a perspective view of a shielding box of Example 2.
Figure 8:
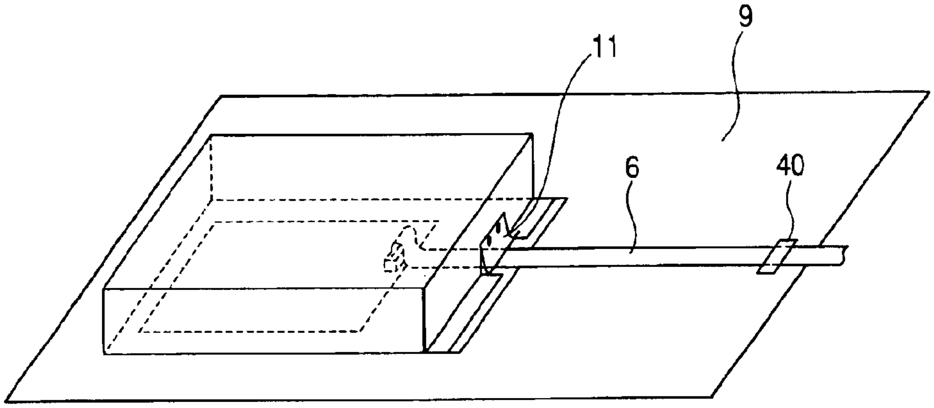
FIG. 8 is a perspective view of a shielding box of Example 2.

FIGS. 6–8 show Example 2 of the present invention. FIG. 6 is a perspective view of the shielding box, having top cover 1 and side plate 21 separated from the main body comprised of bottom metal plate 3 and side plates 22,23 and 24. FIG. 7 is a perspective view of the shielding box, having top cover 1 and side plate 21 attached to the main body comprised of bottom metal plate 3 and side plates 22, 23 and 24. FIG. 8 is a perspective view of the shielding box placed on casing body 9.

The lower end of side plate 21 is notched at the middle portion thereof to form rectangular notch 10. This rectangular notch and bottom metal plate 3 form aperture 8. Elastic metal member 11 for closing aperture 8 is fixed to side plate 21 by screws 13. The numerals 12*a* and 12*b* denote holes formed through the elastic member and side plate 21 for insertion screws 13. Elastic member 11 has at least a size sufficient to cover aperture 8, and is warped in a U-shape at the lower end.

Cable 6 is pressed at aperture 8 against bottom metal plate 3 by elastic member 11 functioning as a cable-regulating portion for regulating the cable as shown in FIG. 7, and is wired along casing body 9 to a separate apparatus as shown in FIG. 8. The numeral 40 denotes a pressing member like a tape for fixation of cable 6.

With such a structure, the free area of the aperture of the shielding box can be decreased to reduce radiation noise leaking out from the shielding box. Further with such a constitution, cable 6 can be led out in complete contact with bottom metal plate 3 and casing body 9 outside the shielding box to reduce remarkably radiation noise caused by common-mode current in cable 6.

Elastic member 11 fixes surely the position of cable 6 by pressing the cable 6 against bottom metal plate 3 and casing body 9 without damaging cable 6. Elastic member 11 is exchangeable for another one having different elasticity, thus capable of fitting with various thicknesses of the cables, being suitable for multiple usage of the shielding box.

EXAMPLE 3

Figure 9:
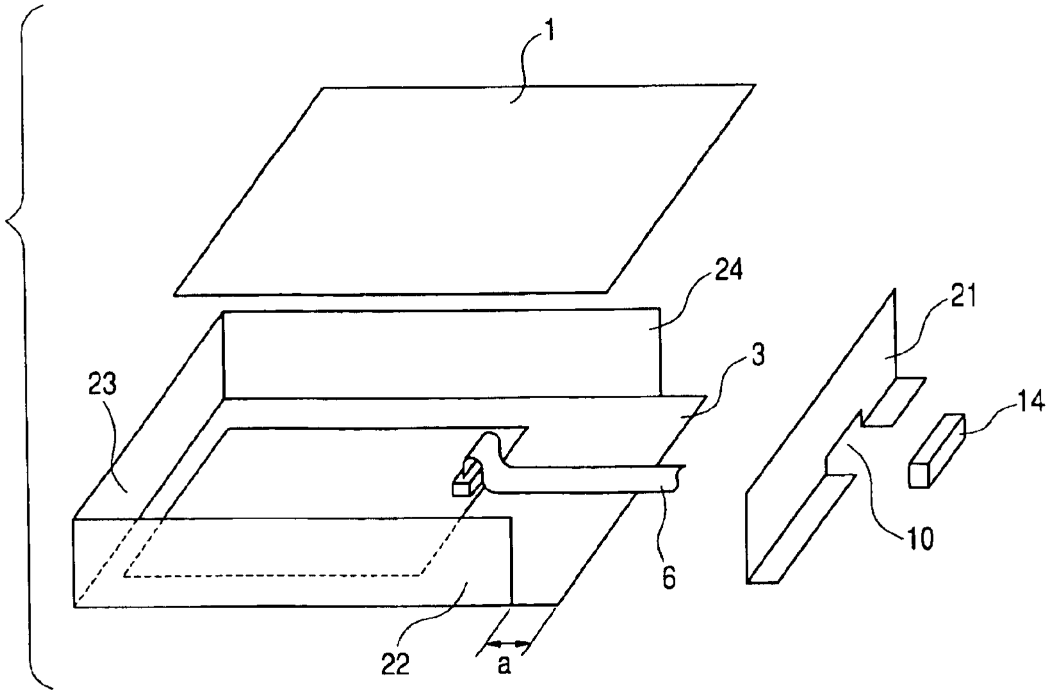
FIG. 9 is a perspective view of an exploded shielding box of Example 3.
Figure 10:
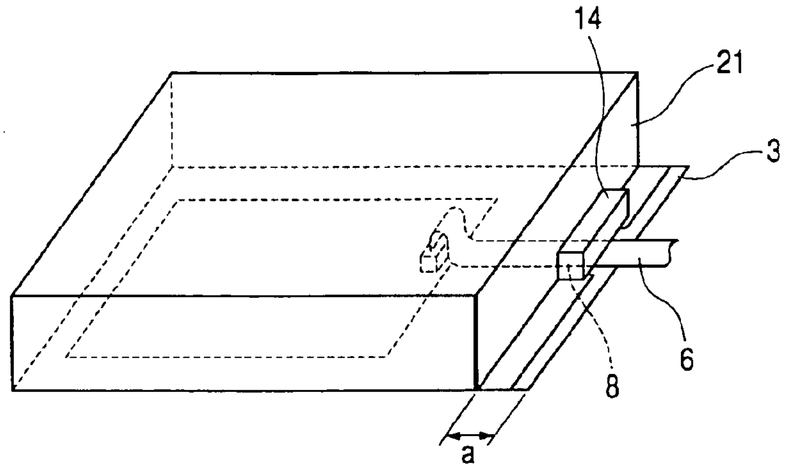
FIG. 10 is a perspective view of a shielding box of Example 3.

FIGS. 9 and 10 show Example 3 of the present invention. FIG. 9 is a perspective view of the shielding box, having top cover 1 and side plate 21 separated from the main body comprised of bottom metal plate 3 and side plates 22, 23 and 24. FIG. 10 is a perspective view of the shielding box, having top cover 1 and side plate 21 attached to the main body.

The lower end of side plate 21 is notched at the middle portion thereof to form rectangular notch 10. This rectangular notch and bottom metal plate 3 form aperture 8. Elastic rubber member 14 seals aperture 8. This elastic member 14 has at least a size sufficient to cover aperture 8. Cable 6 is pressed at aperture 8 against bottom metal plate 3 by the elasticity of elastic member 14 functioning as a cable-regulating portion for regulating the cable as shown in FIG. 10, and is wired along casing body 9 to a separate apparatus.

With such a structure, the free area of the aperture of the shielding box can be decreased to reduce radiation noise leaking out from the shielding box. Further with such a constitution, cable 6 can be led out in complete contact with bottom metal plate 3 and casing body 9 outside the shielding box to reduce remarkably radiation noise caused by common-mode current in cable 6.

Elastic member 14 fixes surely the position of cable 6 by pressing the cable 6 against bottom metal plate 3 and casing body 9 without damaging cable 6. Elastic member 14 can be formed by a simple method, that is, the cable-regulating portion can be prepared by the simple method. Elastic member 14 is exchangeable for another one having different elasticity, thus capable of fitting with various thicknesses of the cables, being suitable for multiple usage of the shielding box.

EXAMPLE 4

Figure 11:
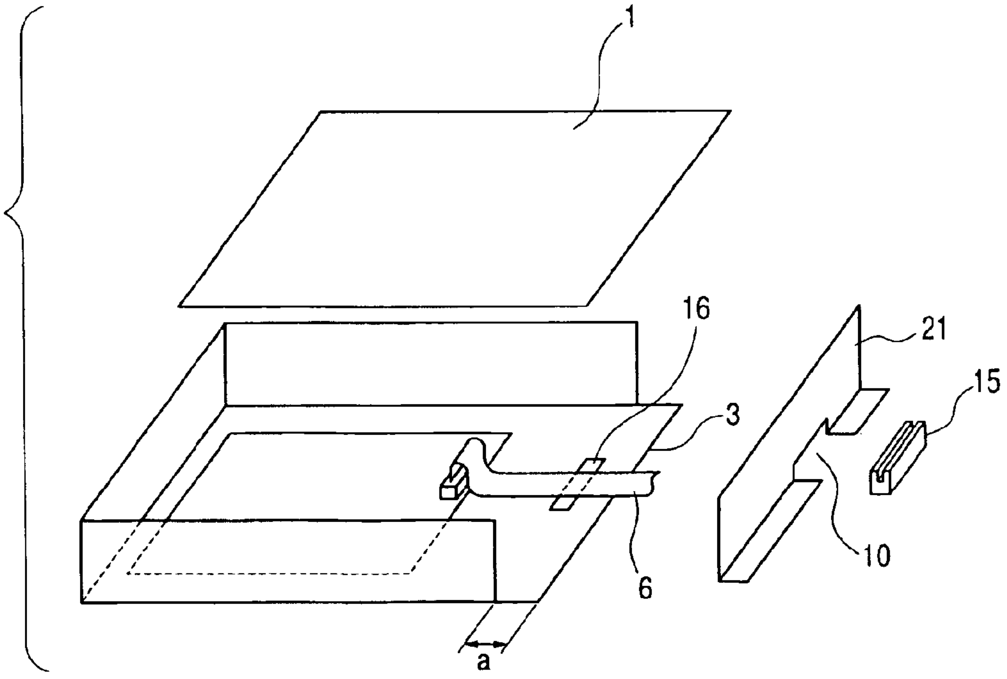
FIG. 11 is a perspective view of an exploded shielding box of Example 4.
Figure 12:
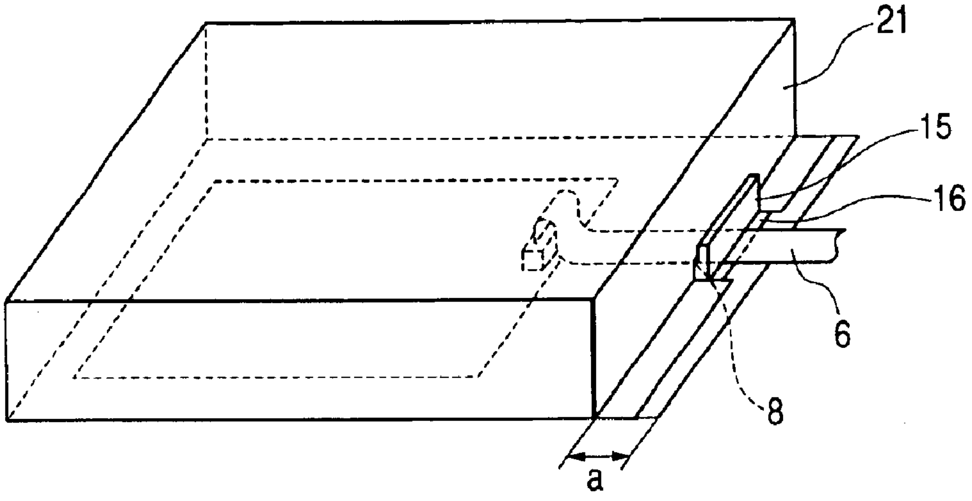
FIG. 12 is a perspective view of a shielding box of Example 4.
Figure 13:
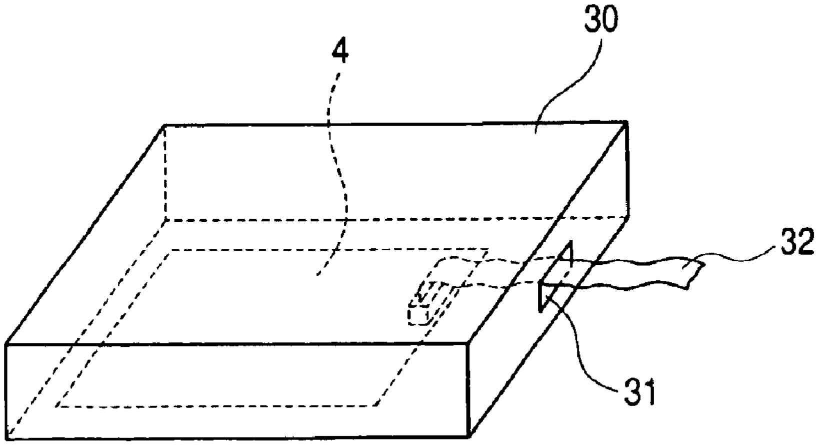
FIG. 13 is a perspective view of a shielding box of a prior technique.

FIGS. 11 and 12 show Example 4 of the present invention. FIG. 11 is a perspective view of the shielding box, having top cover 1 and side plate 21 separated from the main body comprised of bottom metal plate 3 and side plates 22,23 and 24. FIG. 12 is a perspective view of the shielding box, having top cover 1 and side plate 21 attached to the main body of the shielding box.

The lower end of side plate 21 is notched at the middle portion thereof to form rectangular notch 10. This rectangular notch and bottom metal plate 3 form aperture 8 similarly as in Example 2. The numeral 15 denotes an elastic rubber member containing a high dielectric loss material and having a slit of a width corresponding to the thickness of the side plate along the center line of a face thereof. Elastic member 15 has at least a size sufficient to cover aperture 8, and is fixed by fitting the lower middle end portion of side plate 21 into the slit as shown in FIG. 12. Cable 6 is pressed at aperture 8 against bottom metal plate 3 by elasticity of elastic member 15, and is wired along the casing body to a separate apparatus. The numeral 16 denotes a pressing member like a tape for fixation of cable 6.

With such a structure, the free area of the aperture of the shielding box can be decreased to reduce radiation noise leaking out from the shielding box. Further with such a constitution, cable 6 can be led out complete contact with bottom metal plate 3 and casing body 9 outside the shielding box to reduce remarkably radiation noise caused by common-mode current in cable 6.

Elastic member 15 fixes surely the position of cable 6 by pressing the cable 6 surely against bottom metal plate 3 and casing body 9 without damaging cable 6. Also this cable-regulating member can be formed by a simple method. Elastic member 15 is exchangeable for another one having different elasticity, thus capable of fitting with various thicknesses of the cables, being suitable for multiple usage of the shielding box. The elastic member containing a high dielectric loss material reduces the radiation loss at a high frequency range of higher than several hundred MHz by converting the radiation noise into dielectric loss.

The above Examples illustrate preferred embodiments of the present invention. The present invention is not limited thereto, and includes various modifications within the scope of the gist of the present invention.

The shielding box, electronic apparatus, and cable fixing method of the present invention enables reduction of radiation noise leaking through an aperture by keeping compact the size of the shielding box without employing a relatively large protrusion like a waveguide, and enables also to reduces radiation noise caused by common-mode of the cable.

What is claimed is:

1. An electronic apparatus comprising a printed circuit board; a cable connected to the printed circuit board; and a shielding box which is comprised of a top cover, a bottom metal plate and side plates for encasing the circuit board therein and from which the cable is led out through an aperture formed at the lower end of one of the side plates, wherein the cable led out of the shielding box is kept pressed by the one of the side plates against the bottom metal plate.

2. The electronic apparatus according to claim 1, wherein the lower end has a first section for pressing the cable, and a second section for fixation to the bottom metal plate, and the aperture is formed with a bent portion at which the first section is joined and the face of the bottom metal plate to have an aperture height corresponding to the thickness of the cable.

3. The electronic apparatus according to claim 2, wherein the bottom metal plate extends to form a projection toward a leading-out direction of the cable, the second section joining the lower end is a second tab formed toward the cable leading-out direction, and the projection and the second tab are connected and fixed together.

4. The electronic apparatus according to claim 3, wherein the first section joining the lower end is a first tab formed toward the cable leading-out direction, which tab presses the cable against the projection.

5. An electronic apparatus comprising a printed circuit board; a cable connected to the printed circuit board; a shielding box which is comprised of a top cover, a bottom metal plate, and side plates for encasing the circuit board therein and from which the cable is led out through an aperture formed at the lower end of one of the side plates; and a cable-regulating portion which seals the aperture and presses the cable against the bottom metal plate.

6. The electronic apparatus according to claim 5, wherein the cable-regulating portion is comprised of an elastic member.

7. The electronic apparatus according to claim 6, wherein the elastic member comprises an electroconductive material or high dielectric loss material.

8. The electronic apparatus according to claim 6, wherein the cable-regulating portion has a slit, and is attached to the side plate of the shielding box with the slit.

9. An electronic apparatus comprising a printed circuit board; a cable connected to the printed circuit board; a shielding box which is comprised of a top cover, a bottom metal plate and side plates for encasing the circuit board therein and from which the cable is led out through an aperture formed at the lower end of one of the side plates; and a casing body for carrying the shielding box, wherein the cable led out of the shielding box is kept pressed by the one of the side plates against the bottom metal plate, and the cable led out is wired along the casing body.

* * * * *

UNITED STATES PATENT AND TRADEMARK OFFICE

CERTIFICATE OF CORRECTION

PATENT NO. : 6,870,094 B2 
DATED : March 22, 2005
INVENTOR(S) : Toru Otaki

It is certified that error appears in the above-identified patent and that said Letters Patent is hereby corrected as shown below:

<u>Column 1,</u>
Line 66, "of the" should be deleted.

<u>Column 5,</u>
Line 14, "projecting" should read -- the projection --; and
Line 15, "in" should read -- of --.

Signed and Sealed this

Seventeenth Day of January, 2006

JON W. DUDAS
*Director of the United States Patent and Trademark Office*